United States Patent
Mohan et al.

(10) Patent No.: US 7,098,540 B1
(45) Date of Patent: Aug. 29, 2006

(54) ELECTRICAL INTERCONNECT WITH MINIMAL PARASITIC CAPACITANCE

(75) Inventors: Jitendra Mohan, Santa Clara, CA (US); Luu Nguyen, San Jose, CA (US); Alan Segervall, Half Moon Bay, CA (US); Stephen Gee, Danville, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 238 days.

(21) Appl. No.: 10/729,389

(22) Filed: Dec. 4, 2003

(51) Int. Cl.
*H01L 23/48* (2006.01)
*H01L 23/52* (2006.01)
*H01L 29/40* (2006.01)

(52) U.S. Cl. ............... 257/773; 257/737; 257/778
(58) Field of Classification Search ........... 257/738, 257/737, 773, 778, 782
See application file for complete search history.

(56) References Cited

U.S. PATENT DOCUMENTS

| | | | | |
|---|---|---|---|---|
| 5,561,308 A * | 10/1996 | Kamata et al. | ............. | 257/301 |
| 5,726,501 A * | 3/1998 | Matsubara | .................. | 257/778 |
| 5,889,300 A * | 3/1999 | Figura et al. | ............... | 257/303 |
| 6,222,270 B1 * | 4/2001 | Lee | ............................. | 257/758 |
| 6,410,415 B1 * | 6/2002 | Estes et al. | .................. | 438/612 |
| 6,448,641 B1 * | 9/2002 | Ker et al. | .................... | 257/700 |
| 6,465,895 B1 * | 10/2002 | Park et al. | ................... | 257/782 |
| 6,498,056 B1 * | 12/2002 | Motsiff et al. | ............. | 438/131 |
| 6,518,667 B1 * | 2/2003 | Ichida et al. | ................ | 257/738 |
| 6,590,287 B1 * | 7/2003 | Ohuchi | ...................... | 257/738 |
| 6,633,087 B1 * | 10/2003 | Ker et al. | .................... | 257/786 |
| 6,780,673 B1 * | 8/2004 | Venkateswaran | ............ | 438/108 |
| 6,927,347 B1 * | 8/2005 | Yamaguchi et al. | ....... | 174/260 |
| 2002/0182773 A1 * | 12/2002 | Su et al. | .................... | 438/111 |
| 2003/0034567 A1 * | 2/2003 | Sato et al. | ................... | 257/786 |
| 2003/0232492 A1 * | 12/2003 | Venkateswaran | ............ | 438/612 |
| 2004/0238956 A1 * | 12/2004 | Murtuza et al. | ............ | 257/738 |

* cited by examiner

*Primary Examiner*—Hoai Pham
*Assistant Examiner*—Mursalin B. Hafiz
(74) *Attorney, Agent, or Firm*—Beyer Weaver & Thomas LLP

(57) ABSTRACT

The invention discloses an electrical interconnect with minimal parasitic capacitance. In one embodiment, an apparatus comprises a semiconductor substrate, and first and second support structures formed on the substrate, where the second support structure at least partially surrounds the first support structure on the substrate. The first and second support structures are each configured to support an electrical connector to be formed over the first and second support structures on the substrate.

16 Claims, 3 Drawing Sheets

ELECTRICAL INTERCONNECT WITH MINIMAL PARASITIC CAPACITANCE

BRIEF DESCRIPTION OF THE INVENTION

This invention relates generally to semiconductor fabrication. More specifically, this invention relates to electrical interconnects having minimal parasitic capacitance.

BACKGROUND OF THE INVENTION

The drive for faster, more reliable, and more compact computer components has led to extensive use of electrical interconnects such as solder ball connectors. Solder ball interconnects are a commonly employed device for connecting semiconductor dice to the leads of a package, or other components. This approach is exemplified by modern flip chip designs, where a die itself is used as a package, and solder balls on the die are used to attach the package to a printed circuit board. For more information on flip chips, see National Semiconductor's MicroSMD package datasheets, which are incorporated herein by reference. When used in this manner, solder ball connectors can offer significant advantages. For example, solder balls produce low parasitic inductance in relation to the longer bond wires typically used with more traditional packages, thus making them more suitable for some high-speed applications. Flip chips with solder balls also take up significantly less space than other types of packages, allowing for devices with much smaller footprints.

Even though these solder ball interconnects provide flip chip packages many advantages, such interconnects are not without their disadvantages. Solder balls are subjected to stresses during various semiconductor fabrication operations, and often transmit these stresses to the delicate circuitry of semiconductor dies. For example, solder balls are often compressed during various fabrication processes, such as when flip chip solder balls are pressed against the printed circuit board during attachment. Such compressive forces can crush the underlying circuitry of the die.

To alleviate this problem, conductive bump pads are often placed underneath the solder balls to spread any stresses out over a wider area and protect any underlying circuits. However, such bump pads can generate a parasitic capacitance when placed too close to active circuitry, thus hindering performance of the circuits. To further explain this problem, FIG. 1A illustrates a cutaway side view of a solder bump interconnect constructed in accordance with the prior art. Ordinarily, a semiconductor substrate 300 has a number of interconnects 200 formed on it, to allow for electrical connection to other devices. The interconnect has a circularly shaped, or dislike, bump pad 210 (a top view of which is illustrated in FIG. 1B) followed by a passivation layer 220, a benzocyclobutene (BCB) layer 230, a layer of under bump metal (UBM) 240 for better solder adherence, and a solder ball 250.

When the solder ball 250 is subjected to forces, such as when it is compressed during attachment to a printed circuit board, these forces generate stresses in the circuitry within the substrate 300. Accordingly, rigid bump pads 210 are placed underneath the solder ball 250 to distribute stresses over a larger area. One can easily see that, absent the bump pad 210, stresses would be roughly concentrated in the area of the passivation opening 260, whereas the bump pad 210 instead acts to distribute stresses generally over the entire area associated with its outer radius 270. However, the large bump pad 210 is also electrically conductive, and acts to electrically connect the solder ball 250 to other circuitry within the substrate 300. Consequently, the bump pad 210 interacts with underlying circuitry to produce a parasitic capacitance. Indeed, such parasitic capacitances are common in situations such as these, where an electrically active bump pad 210 and electrically active circuits within the substrate 300 are placed close together yet separated by a dielectric (here, the dielectric or passivation material deposited between the circuits and the bump pad 210 to insulate them from each other), allowing a capacitative charge to build. Specifically, the size of the bump pad 210 means that any circuitry within the substrate 300 and underneath the bump pad 210 can contribute to parasitic capacitance, reducing chip performance, especially in the multi-GHz range.

It would therefore be desirable to develop an electrical interconnect capable of supporting a solder bump and alleviating any of its associated stresses, while generating minimal parasitic capacitance.

SUMMARY OF THE INVENTION

The invention discloses an electrical interconnect with minimal parasitic capacitance. In one embodiment, an apparatus comprises a semiconductor substrate, and first and second support structures formed on the substrate, where the second support structure at least partially surrounds the first support structure on the substrate. The first and second support structures are each configured to support an electrical connector to be formed over the first and second support structures on the substrate. Such an arrangement reduces the overall parasitic capacitance associated with the support structures.

The invention also discloses methods of forming such an interconnect. In one embodiment, a method of supporting an electrical connector comprises fabricating first and second pads on a semiconductor die, the first and second pads each overlaying electronic circuitry and each configured to support a solder bump interconnect. The first and second pads are fabricated so that the second pad at least partially surrounds the first pad and is electrically insulated from the first pad so as to reduce generation of capacitance between the second pad and the electronic circuitry.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Many current solder bump interconnects utilize a disclike solder bump pad to distribute mechanical stresses and protect underlying circuitry. From a mechanical standpoint, solder bump pads should be as wide as possible, in order to distribute stresses over as large an area as possible. However, from an electrical standpoint, large conductive pads create a risk of high parasitic capacitance. A bump pad design that utilizes an inner pad that is electrically insulated from a surrounding outer pad would thus offer both effective stress distribution and low parasitic capacitance. Assuming only the inner pad is electrically connected to the solder ball, both the inner and outer pads would support the solder ball, while only the inner pad risks contributing to parasitic capacitance.

Figure 1:
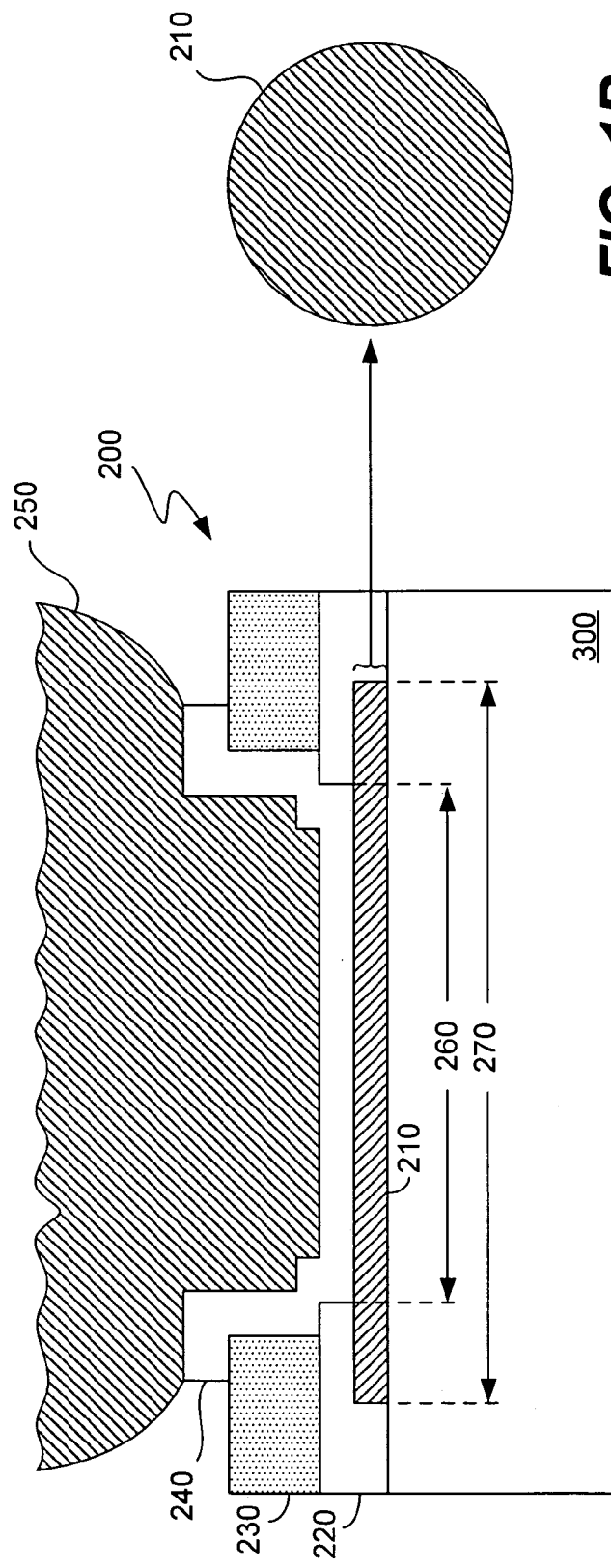
FIG. 1A illustrates a cutaway side view of a solder bump interconnect constructed in accordance with the prior art.
FIG. 1B illustrates a top view of a solder bump pad constructed in accordance with the prior art.
Figure 2:
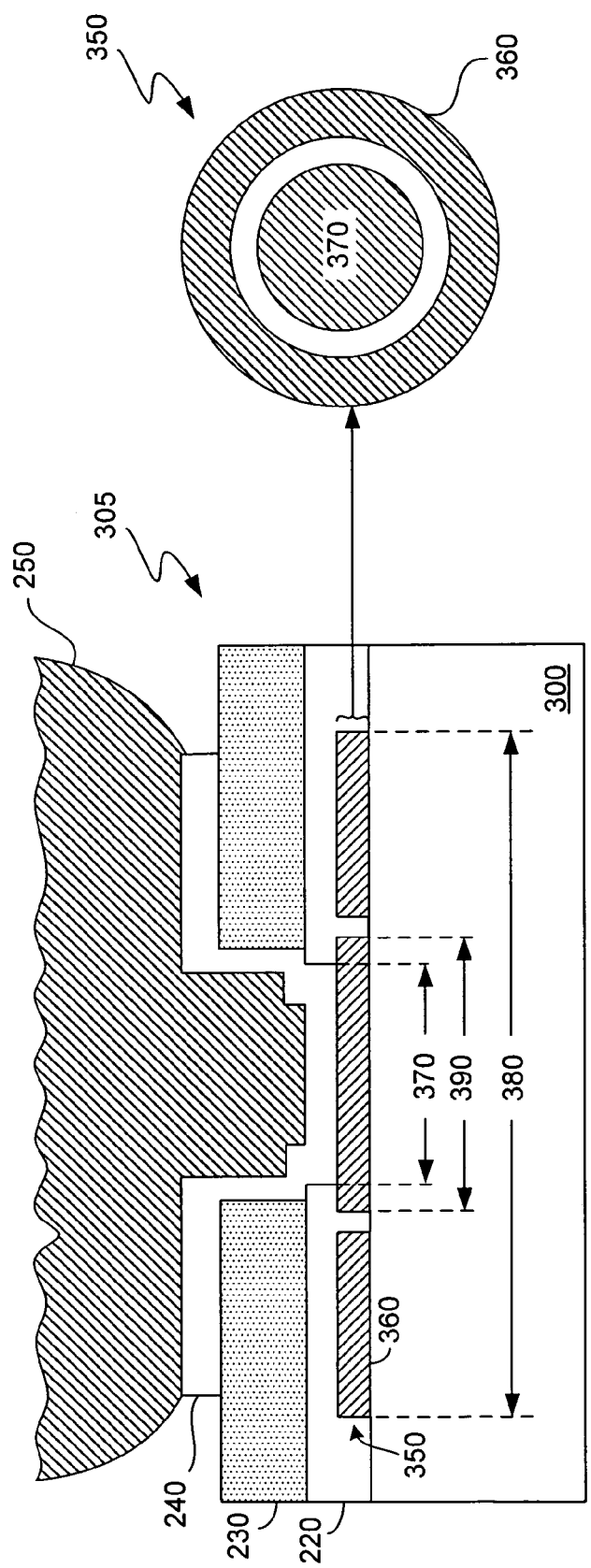
FIG. 2A illustrates a cutaway side view of a solder bump interconnect constructed in accordance with an embodiment of the invention.
FIG. 2B illustrates a top view of a solder bump pad constructed in accordance with an embodiment of the invention.

The embodiment illustrated in FIG. 2A acts to distribute mechanical stresses similar to that of FIG. 1A, but with much less parasitic capacitance. Here, the interconnect 305 comprises a solder ball 250 supported by a two-part bump pad 350 that has an inner disc 370 and a concentric outer ring 360, a top view of which are shown in FIG. 2B. The inner disc 370 lies directly beneath, and is electrically connected to, the solder ball 250, but is electrically insulated from the concentric outer ring 360. Because both the inner disc 370 and outer ring 360 lie underneath the solder ball 250, mechanical stresses are distributed across the entire area associated with the outer radius 380 of the outer ring 360. However, because only the inner disc 370 is electrically insulated from the outer ring 360, only the inner disc 370 contributes to any parasitic capacitance. That is, because the outer ring 360 is not electrically connected to the inner disc 370, only those circuits directly below the inner disc 360 can help to generate a parasitic capacitance.

The reduction in parasitic capacitance offered by the embodiment of FIG. 2A can be more clearly seen with reference to the following known equation:

$$C = \alpha \pi R^2 + \beta 2\pi R$$

where

C=parasitic capacitance, typically measured in Farads (F)

$\alpha$, $\beta$=material-dependent capacitative constants of the dielectric under the bump pad and at the fringe of the bump pad, respectively R=radius of bump pad.

In typical cases where the bump pad and circuitry are separated by a $SiO_2$ layer approximately 5 μm thick, $\alpha$ takes on a value of approximately 7 aF/μm$^2$, and $\beta$ is approximately 30 aF/μm. As the parasitic capacitance C of a bump pad varies roughly as the square of the bump pad's radius R, reducing the radius of the bump pad will significantly reduce the parasitic capacitance associated with the bump pad structure. Thus, while the prior art bump pad 210 can generate a parasitic capacitance proportional to the square of its outer diameter 270, the bump pad of FIG. 2A only generates parasitic capacitance proportional to the square of the diameter 390 of its inner disc 370. Accordingly, typical prior art bump pads 210 with an outer diameter 270 measuring 300 μm and material-dependent constants as above produce an associated parasitic capacitance of approximately 525 fF, whereas bump pads 350 constructed according to the embodiment of FIG. 2A have an outer diameter 270 on the order of about 150 μm wide, generating a parasitic capacitance of only approximately 135 fF.

As the area associated with outer diameter 270 is much greater than the area associated with the diameter 390 of the inner disc 370, the two-part bump pad 350 typically acts to generate significantly less parasitic capacitance than prior art bump pads 210. Yet despite this fact, the two-part bump pad 350 distributes mechanical stresses in a manner similar to the prior art bump pad 210, thus offering the same advantages as the prior art, with minimal disadvantages.

The bump pad 350 and the remainder of the interconnect 305 can be fabricated according to known techniques. More specifically, the inner disc 370 and outer ring 360 are first deposited as a metal layer, which is masked and etched into the proper shape. One of skill will realize that the metal layer (and consequently the inner disc 370 and outer ring 360) is typically aluminum, but can be any conductive material that is sufficiently rigid to support stresses from the solder ball 250. Indeed, the outer ring 360 need not be made from a conductive material and can be any sufficiently rigid material, but often it is desirable to fabricate both the inner disc 370 and outer ring 360 from the same material.

A passivation layer 220 is then deposited, masked, and etched to expose the inner disc 370. A BCB layer 230 is then deposited and etched to keep the inner disc 370 exposed, and a UBM layer 240 is deposited to provide a surface compatible with the solder ball 250. A solder ball 250 can then be reflowed onto the UBM layer 240. Here also, the passivation layer 220, BCB layer 230, and UBM layer 240 are all fabricated according to well-known methods.

It should be noted that, while the invention is discussed in the context of solder ball connections, the concepts and principles apply in more general fashion to various other types of connections. For example, the bump pad structures of the invention can be equally applied to distribute stresses underneath a wire bond pad or other types of electrical interconnects used to connect circuitry within semiconductor dies to external components. As a result, the invention should not be construed as limited to simply the solder ball context. Rather, the solder ball context should be seen as simply one among many contexts applicable to the invention, and used simply for purposes of explanation in order to more clearly illustrate the invention.

It should also be noted that, while the bump pad 350 is configured as a disc surrounded by a concentric outer ring, the invention should not be construed as being limited to this specific configuration. Many other configurations offer the same advantages, and are thus within the scope of the invention. For example, non-circular inner discs, such as square or elliptical shapes, also act to support solder balls 250 and are therefore contemplated by the invention. Similarly, inner structures, whether disclike or not, can be surrounded by outer structures that are neither concentrically placed, nor designed as rings. The invention includes, for example, a square-shaped inner structure surrounded by a non-concentric structure having an elliptical cross-section. Also, there is no reason why the outer structure must completely surround the inner structure. The invention therefore simply contemplates an electrical interconnect with multiple support structures of various shapes, where a first such support structure is at least partially surrounded by a second such support structure, and both of these structures act to distribute mechanical stresses.

Figure 3:
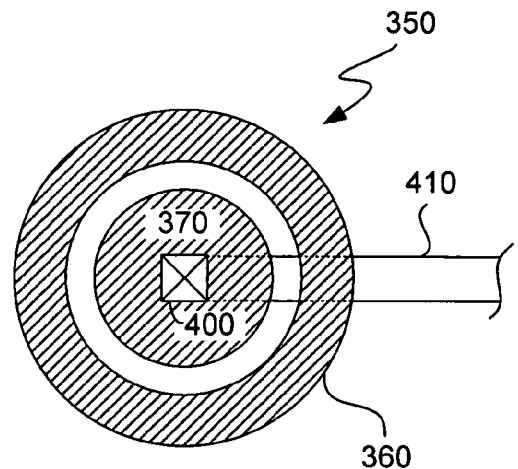
FIG. 3 illustrates a top view of a solder bump pad and connecting line constructed in accordance with an embodiment of the invention.

While prior art bump pads 210 are single unitary structures that can be easily connected to surrounding circuitry, the inner disc 370 is surrounded by, and not electrically connected to, the outer ring 360. Nevertheless, electrical connection to the inner disc 370 can still be accomplished through a number of configurations. FIG. 3 illustrates a top view of one configuration of a bump pad 350 in which the inner disc 370 is electrically connected to other circuitry within the substrate 300 by a feed-through 400 and connecting wire 410. Typically, the connecting wire 410 is fabricated on a layer underlying the inner disc 370, subsequent layers are built up over the wire 410, and a hole is etched in these layers. The feed-through 400 and inner disc 370 are then deposited at the same time, using conventional metal deposition techniques. In this manner, the connecting wire 410 and feed-through 400 provide a conductive path allowing for electrical connection between various substrate 300 circuitry and the solder ball 250.

Figure 4A:
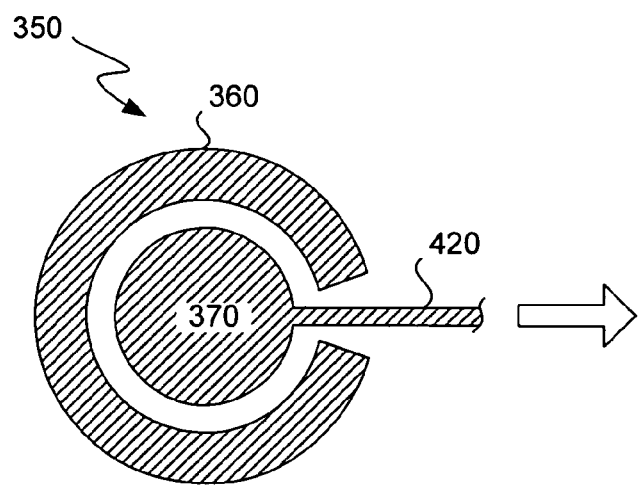
FIG. 4A illustrates a top view of a solder bump pad and connecting line constructed in accordance with an embodiment of the invention.

The configuration of FIG. 3 would be easier to fabricate if the connecting wire 410 were co-planar with the bump pad 350. Accordingly, FIG. 4A illustrates a top view of another configuration of the bump pad 350, in which the inner disc 370 is electrically connected to a co-planar connecting wire 420. Because the outer ring 360 must remain electrically insulated from the inner disc 370, the outer ring 360 is fabricated in a C-shape, with a gap that allows the connecting wire 420 to pass through in the same plane as the bump pad 350.

Figure 4B:
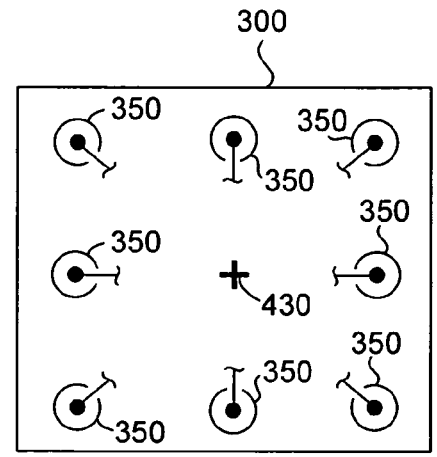
FIG. 4B illustrates a top view of a semiconductor die with solder bump pads and connecting lines oriented in accordance with an embodiment of the invention.

Because the outer ring 360 is weaker in the area of the connecting wire 420, it is often beneficial to orient all such bump pads 350 so that the gap in the outer ring 360 faces toward the geometric center of the substrate 300. In such an orientation, cracks are less likely to form, as the outer ring 360 is weakest toward the geometric center of the die, rather than toward an edge of the die, where cracks can more easily form and propagate due to defects in the cleaved surfaces of the die. This is illustrated in FIG. 4B, which highlights a top view of a substrate 300 having a geometric center 430. Here, a number of bump pads 350, distributed in various locations on the upper surface of the substrate 300, are oriented so that the gaps in their outer rings 360 are generally oriented toward the geometric center 430 of the substrate 300. Pressure from solder balls 250 would then tend to form cracks, if any, that are preferentially oriented toward the geometric center 430. Such cracks would tend to propagate in that direction, rather than toward the edges of the substrate 300.

The foregoing description, for purposes of explanation, uses specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. Obviously many modifications and variations are possible in view of the above teachings. For instance, it has been emphasized above that the invention includes multiple configurations of bump pads, which may be used to support solder bumps as well as other electrical connectors on a semiconductor substrate. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An apparatus, comprising:
a semiconductor substrate; and
first and second support structures formed on the substrate, the second support structure at least partially surrounding the first support structure on the substrate wherein the second support structure comprises a substantially annular cross-section located approximately concentric with the first support structure,
the first and second support structures each arranged beneath and configured to support an electrical connector to be formed over the first and second support structures on the substrate.

2. The assembly of claim 1 wherein the first support structure further comprises a substantially circular cross-section.

3. The assembly of claim 1 wherein the first support structure is made of aluminum.

4. The assembly of claim 1 wherein the second support structure is made of aluminum.

5. The assembly of claim 1 wherein the first and second support structures each overlay electronic circuitry fabricated on a semiconductor die.

6. The assembly of claim 5 wherein the second support structure is electrically insulated from the first support structure, so as to reduce the capacitance generated between the second support structure and the electronic circuitry.

7. The assembly of claim 1 wherein the semiconductor substrate has a geometric center, and wherein the first support structure further comprises a conductive element having at least a portion oriented toward said geometric center.

8. The assembly of claim 7 wherein the second support structure further comprises a substantially annular circumferential segment, the circumferential segment being located approximately concentric with the first support structure and electrically insulated from the conductive element.

9. An assembly for supporting an electrical connector with minimal parasitic capacitance, comprising:
first and second pads formed on a semiconductor substrate, the first and second pads underlying a solder bump interconnect and overlaying electronic circuitry;
the second pad comprises a substantially annular cross-section located approximately concentric with the first pad and arranged to at least partially surrounding the first pad so as to support the solder bump interconnect; and
the second pad being electrically insulated from the first pad so as to reduce the capacitance generated between the second pad and the electronic circuitry.

10. The assembly of claim 9 wherein the first and second pads each overlay electronic circuitry fabricated on a semiconductor die.

11. The assembly of claim 9 wherein the first pad further comprises a substantially circular cross-section.

12. The assembly of claim 9 wherein the first pad is made of aluminum.

13. The assembly of claim 9 wherein the second pad is made of aluminum.

14. The assembly of claim 9 wherein the semiconductor substrate has a geometric center, and wherein the first pad further comprises a conductive element having at least a portion oriented toward said geometric center.

15. The assembly of claim 14 wherein the second pad further comprises a substantially annular circumferential segment, the circumferential segment being located approximately concentric with the first pad and electrically insulated from the conductive element.

16. An apparatus, comprising:
a semiconductor substrate; and
first and second support structures formed on the substrate, the second support structure at least partially surrounding the first support structure on the substrate, the first and second support structures each configured to support an electrical connector to be formed over the first and second support structures on the substrate,
the second support structure comprising a substantially annular cross-section located approximately concentric with the first support structure.

* * * * *